United States Patent [19]
Ou

[11] Patent Number: 5,862,465
[45] Date of Patent: Jan. 19, 1999

[54] HYSTERESIS-FREE ANTI-SATURATION CIRCUIT

[75] Inventor: Waho Ou, Tokyo, Japan

[73] Assignee: Oki Electric Industry Co., Ltd., Tokyo, Japan

[21] Appl. No.: 774,784

[22] Filed: Dec. 30, 1996

[30] Foreign Application Priority Data

Jan. 29, 1996 [JP] Japan .................................. 8-012447

[51] Int. Cl.$^6$ ................................................ H04B 1/06
[52] U.S. Cl. .................................. 455/234.1; 455/250.1; 455/254
[58] Field of Search ................................ 455/217, 232.1, 455/234.1, 234.2, 239.1, 240.1, 241.1, 242.1, 242.2, 243.1, 244.1, 245.2, 249.1, 250.1, 251.1, 254; 348/678, 685; 330/129, 279; 375/345

[56] References Cited

U.S. PATENT DOCUMENTS

| | | | |
|---|---|---|---|
| 4,553,105 | 11/1985 | Sasaki | 455/250.1 |
| 4,742,565 | 5/1988 | Iwahashi | 455/250.1 |
| 5,036,527 | 7/1991 | Halim et al. | 455/242.1 |
| 5,377,231 | 12/1994 | Sonntag | 455/234.1 |
| 5,507,023 | 4/1996 | Suganuma et al. | 455/250.1 |
| 5,603,114 | 2/1997 | Tomita | 455/250.1 |

FOREIGN PATENT DOCUMENTS 2-55428A 2/1990 Japan .................................. 455/249.1

*Primary Examiner*—Thanh Cong Le
*Attorney, Agent, or Firm*—Rabin & Champagne, P.C.

[57] ABSTRACT

An anti-saturation circuit controls the gain of a variable-gain element in the front-end section of a receiver, responsive to a desired signal strength indicated by an indicator signal. The gain of the variable-gain element varies monotonically over a certain range, being reduced as the desired signal strength increases, in order to avoid intermodulation of the desired signal with an interfering signal. If the receiver also has an automatic-gain-control circuit, the automatic-gain-control signal is adjusted to compensate for the changing gain of the variable-gain element.

11 Claims, 8 Drawing Sheets

HYSTERESIS-FREE ANTI-SATURATION CIRCUIT

BACKGROUND OF THE INVENTION

The present invention relates to an anti-saturation circuit for preventing saturation in a communications receiver despite the presence of a strong interfering signal.

Saturation in this context refers to a condition in which an amplifier or other circuit element becomes overloaded and cannot respond linearly to an input signal. Communications receivers generally have an automatic-gain-control facility that avoids this condition by keeping the level of the desired signal below the saturation level, but when an interfering signal stronger than the desired signal is present, saturation may occur despite automatic gain control. Depending on the frequency relationship between the desired signal and interfering signal, the result will be intermodulation interference, defined in the IEEE Standard Dictionary of Electrical and Electronics Terms as "modulation products attributable to the components of a complex wave that on injection into a nonlinear circuit produce interference on the desired signal."

One system in which intermodulation causes problems is the North American code-division multiple-access (CDMA) digital cellular telephone system, which receives strong interfering signals from the analog Advanced Mobile Phone System (AMPS). CDMA receivers are designed for linear operation of their circuit elements up to a specified level of interference, but interference from nearby AMPS stations can easily exceed the specified level. If saturation occurs, the resulting intermodulation products impair the sensitivity of the receiver, making further anti-saturation measures necessary.

A simple anti-saturation scheme employed in conventional CDMA receivers reduces the gain of the low-noise amplifier that amplifies the radio-frequency signal received from the antenna. The low-noise amplifier operates with a standard fixed gain until the strength of the desired signal reaches a certain threshold; then the gain is reduced by a fixed amount. To avoid oscillation between the standard and reduced gain values, a pair of thresholds is employed. The standard gain is used below the lower threshold, the reduced gain is used above the upper threshold, and the standard or reduced gain is left unchanged between the two thresholds. The gain control characteristic is thus a step-function with hysteresis.

This simple system is unsatisfactory for several reasons. A first reason is that, to allow a margin for fading, the lower threshold must be set conservatively, at a relatively high value, leaving a large range of signal strengths over which no anti-saturation measures are taken. A second reason is that a gain reduction large enough to have an adequate anti-saturation effect is also large enough to impair the receiver sensitivity in the region just above the lower threshold. A third reason is that the abrupt switching of the low-noise-amplifier gain between the standard and reduced values tends to disrupt automatic gain control, even if a compensatory signal is applied to the automatic-gain-control amplifier. In CDMA systems, the strength of the received signal is used for both receiving and transmitting gain control, so both forms of automatic gain control are disrupted. Further details will be given later.

SUMMARY OF THE INVENTION

It is accordingly an object of the present invention to avoid saturation over a wide range of received signal strengths.

Another object of the invention is to avoid saturation without loss of receiver sensitivity.

A further object is to avoid saturation without disruption of automatic gain control.

The invented anti-saturation circuit operates in a receiver having a front-end section and a back-end section. The front-end section receives and amplifies a high-frequency signal, and converts the high-frequency signal to a lower-frequency signal. The back-end section processes the lower-frequency signal. The front-end section has a first variable-gain element.

From the lower-frequency signal, the anti-saturation circuit generates an indicator signal that indicates a power level of the lower-frequency signal. From the indicator signal, the anti-saturation circuit then generates a first control signal that controls the gain of the first variable-gain element. The gain of the first variable-gain element is made to vary monotonically when the power of the lower-frequency signal is within a certain first range, to remain fixed at a first value when the power of the lower-frequency signal is below the first range, and to remain fixed at a second, higher value when the power of the lower-frequency signal is above the first range. The gain of the variable-gain element preferably varies in a substantially continuous manner between the first and second values.

The receiver may also have a second variable-gain element, used for automatic gain control. The anti-saturation circuit then also generates a second control signal that controls the gain of the second variable-gain element. In one aspect of the invention, the second control signal is held constant when the power level of the lower-frequency signal is within the first range, to compensate for the changing gain of the first variable-gain element.

DETAILED DESCRIPTION OF THE INVENTION

The invention will be described by way of an example with reference to the attached drawings. The example will pertain to CDMA communications apparatus of the type employed in a mobile station such as a portable telephone set.

Figure 1:
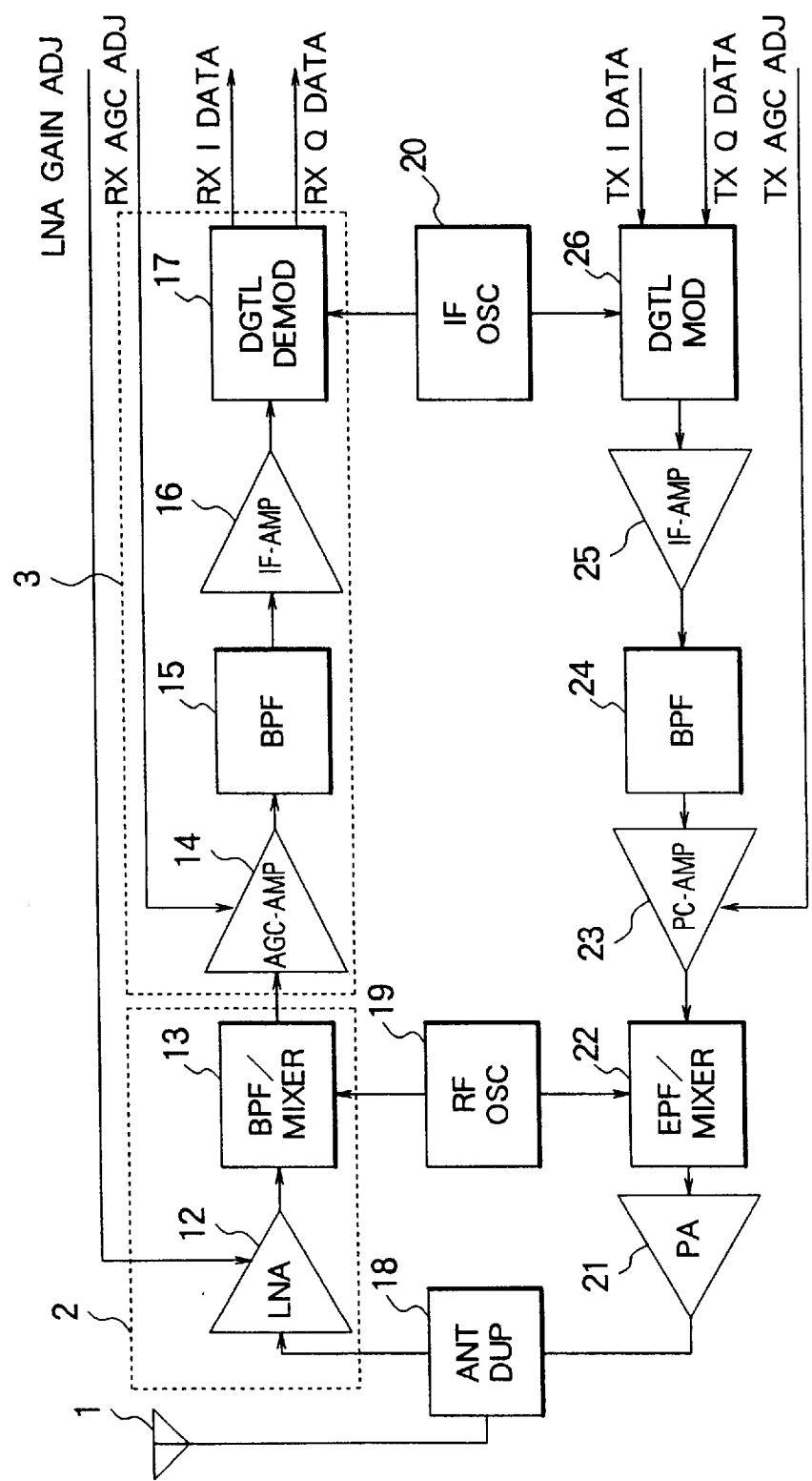
FIG. 1 is a block diagram illustrating transmitting and receiving circuits commonly employed in mobile communications systems.

FIG. 1 shows the transmitting and receiving circuits this apparatus. Both the transmitting and receiving circuits share the same antenna 1.

The receiving circuits can be divided into a front-end section 2 and a back-end section 3. The front-end section 2 comprises a low-noise amplifier (LNA) 12 that amplifies a received radio-frequency signal, and a band-pass filter and mixer (BPF/MIXER) 13 that filters the received signal and down-converts the received signal to an intermediate frequency. The low-noise amplifier 12 is a variable-gain amplifier with a gain that varies in response to an LNA gain adjustment signal (LNA GAIN ADJ). The back-end section 3 comprises an automatic-gain-control amplifier (AGC-AMP) 14 that amplifies the intermediate-frequency signal by an amount controlled by a receive AGC adjustment signal RX AGC ADJ, a band-pass filter (BPF) 15 that rejects frequencies differing from the intermediate frequency, an intermediate-frequency amplifier (IF-AMP) that amplifies the intermediate-frequency signal by a fixed amount, and a digital demodulator (DGTL DEMOD) 17. The digital demodulator 17 demodulates the intermediate-frequency signal by spectrum despreading to produce received in-phase and quadrature data signals RX I DATA and RX Q DATA, also referred to below as baseband signals.

The receiving and transmitting circuits share an antenna duplexer (ANT DUP) 18 that couples the antenna 1 to the low-noise amplifier 12, a radio-frequency local oscillator module (RF OSC) 19 that supplies a high-frequency sinusoidal signal to the band-pass filter and mixer 13, and an intermediate-frequency local oscillator module (IF OSC) 20 that supplies an orthogonal pair of intermediate-frequency sinusoidal signals to the demodulator 17.

The transmitting circuits comprise a power amplifier (PA) 21, a band-pass filter and mixer 22, a power-control amplifier (PC-AMP) 23, a band-pass filter 24, an intermediate-frequency amplifier 25 with a fixed gain, and a digital modulator (DGTL MOD) 26. The digital modulator 26 receives a pair of orthogonal intermediate-frequency sinusoidal signals from the second local oscillator 20, modulates these signals by spectrum spreading and quaternary phase-shift keying (QPSK), responsive to in-phase and quadrature transmit data signals (TX I DATA and TX Q DATA), and thereby produces a modulated intermediate-frequency signal. The intermediate-frequency amplifier 25 amplifies the modulated intermediate signal, and the band-pass filter 24 rejects unwanted frequency components differing from the intermediate frequency. The power-control amplifier 23 is a variable-gain amplifier with a gain that varies in response to a transmit AGC adjustment signal TX AGC ADJ. The band-pass filter and mixer 22 up-converts the signal output from the power-control amplifier 23 to the frequency of a carrier signal received from the radio-frequency local oscillator module 19. The power amplifier 21 amplifies the modulated radio-frequency carrier signal for transmission via the antenna duplexer 18 from the antenna 1.

Figure 2:
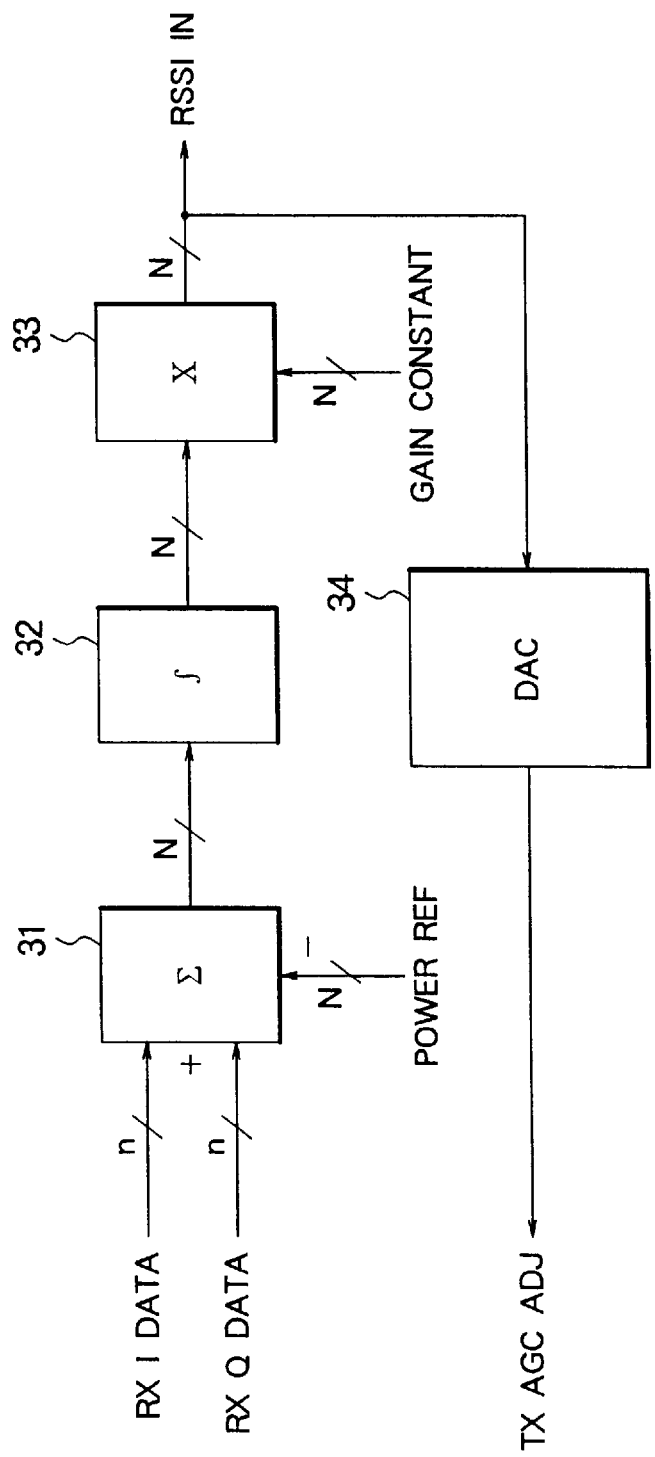
FIG. 2 is a block diagram of additional circuits that output a received signal strength indication.

The apparatus also comprises an indicator circuit, shown in FIG. 2, that generates the transmit AGC adjustment signal (TX AGC ADJ) and a radio signal strength indicator signal RSSI IN. The indicator circuit comprises a summing circuit 31 to which the received data signals (RX I DATA and RX Q DATA) and a power reference signal (POWER REF) are supplied. The received data signals are n-bit digital signals, while the power reference signal is an N-bit digital signal, n and N being suitable positive integers. The summing circuit 31 adds the two received data signals and subtracts the power reference signal from their combined sum, producing an N-bit difference signal.

This difference signal is integrated by an integrator 32 to produce, at periodic intervals, an N-bit integrated signal. The integrated signal is multiplied by a certain gain constant in a multiplier 33 to produce RSSI IN, the value of which indicates the power level of the data signals RX I DATA and RX Q DATA. The RSSI IN value also indirectly indicates the power level of the intermediate-frequency signal from which the data signals are derived, and the electrical field strength of the desired carrier signal at the antenna 1. The RSSI IN value is substantially unaffected by interfering carrier signals such as AMPS signals, which have different carrier frequencies and are therefore rejected before the received signal reaches the digital demodulator 17. RSSI IN is supplied to a digital-to-analog converter (DAC) 34, the analog output of which is the transmit AGC adjustment signal TX AGC ADJ.

Figure 3:
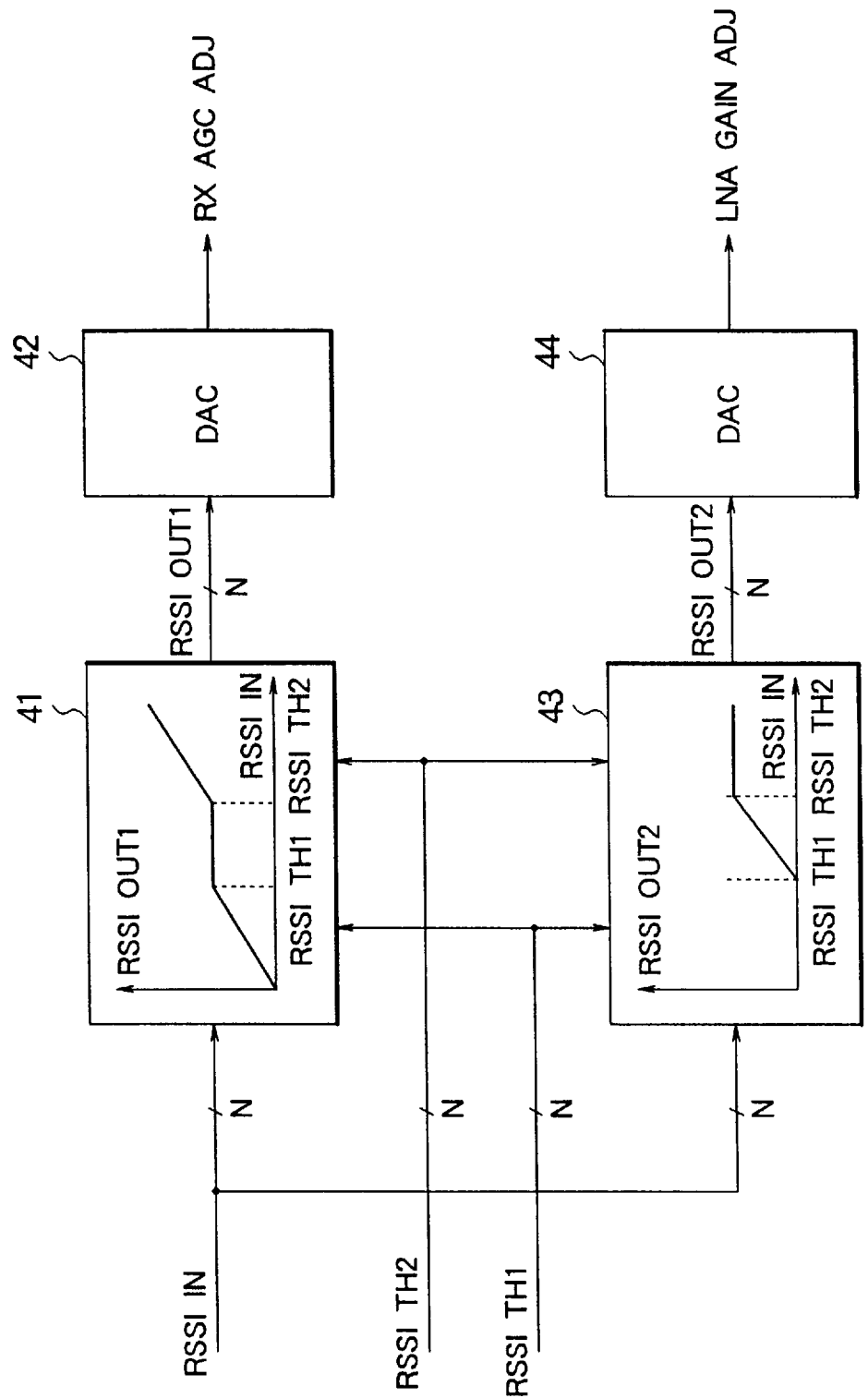
FIG. 3 is a block diagram illustrating a novel circuit for generating the adjustment signals shown in FIG. 1.

FIG. 3 illustrates the novel anti-saturation control circuit that generates the receive AGC and LNA gain adjustment signals RX AGC ADJ and LNA GAIN ADJ. This control circuit receives RSSI IN from the multiplier 33 in FIG. 2, and receives a pair of threshold signals RSSI TH1 and RSSI TH2, all three of these signals being N-bit digital signals. The value of RSSI TH1 is less than the value of RSSI TH2.

These three signals RSSI IN, RSSI TH1, and RSSI TH2 are supplied to a first level-converting circuit 41 that converts the RSSI IN level in a monotonic non-decreasing manner to generate a first digital control signal RSSI OUT1. The input-output characteristic of the first level-converting circuit 41 is as illustrated: RSSI OUT1 increases together with RSSI IN when RSSI IN is less than RSSI TH1 or greater than RSSI TH2, and remains constant when RSSI IN is between RSSI TH1 and RSSI TH2. More precisely, RSSI OUT1=RSSI IN when RSSI IN<RSSI TH1

RSSI OUT1=RSSI TH1 when RSSI TH1<RSSI IN<RSSI TH2

RSSI OUT1=RSSI IN−RSSI TH2+RSSI TH1 when RSSI IN≧RSSI TH2

A digital-to-analog converter 42 converts RSSI OUT1 to an analog signal, which is used as the receive AGC adjustment signal RX AGC ADJ.

RSSI IN, RSSI TH1, and RSSI TH2 are supplied as well to a second level-converting circuit 43, which also converts the RSSI IN level in a monotonic non-decreasing manner, generating a second digital control signal RSSI OUT2. The input-output characteristic of the first level-converting circuit 41 is as illustrated: RSSI OUT2 remains constant when RSSI IN is less than RSSJ TH1 or greater than RSSI TH2, and increases together with RSSJ IN when RSSI IN is between RSSI TH1 and RSSI TH2. More precisely, RSSI OUT2=0 when RSSI IN<RSSI TH1

RSSI OUT2=RSSI IN−RSSI TH1 when RSSI TH1≦RSSI IN<RSSI TH2

RSSI OUT2=RSSI TH2−RSSI TH1 when RSSI IN≧RSSI TH2

Another digital-to-analog converter 44 converts RSSI OUT2 to an analog signal, which is used as the LNA gain adjustment signal LNA GAIN ADJ.

Next the operation of this apparatus will be described.

A description of transmitting operations will be omitted, save to note that the transmitting circuits employ a type of open-loop automatic gain control: the gain of the power control amplifier 23 responds to TX AGC ADJ, which is derived from the received signal, instead of from the transmitted signal. This type of open-loop control enables a CDMA system to serve more subscribers at once, by reducing interference between different subscribers' CDMA signals.

The description of receiving operations will be confined to the control of the gain of the low-noise amplifier 12 and AGC amplifier 14. Other aspects of the receiving operation are conventional and will be familiar to those skilled in the art.

The gain of the low-noise amplifier 12 is continuously variable, rising when the value of the LNA GAIN ADJ signal falls, and falling when the value of the LNA GAIN ADJ signal rises. If the gain when the LNA GAIN ADJ signal has the minimum value of zero is regarded as the standard gain, then the low-noise amplifier 12 can be described as attenuating the received signal (in comparison with the standard gain) by increasing amounts as the LNA GAIN ADJ signal rises.

The gain of the AGC amplifier 14 is also continuously variable, rising when the value of the RX AGC ADJ signal falls, and falling when the value of the RX AGC ADJ signal rises.

When the power level of the received baseband signal is low enough that RSSI IN is less than RSSI TH1, the RSSI OUT1 signal and hence the RX AGC ADJ signal vary continuously, while RSSI OUT2 and LNA GAIN ADJ remain fixed, as can be seen from the equations above, or from the characteristics in FIG. 3. The low-noise amplifier 12 thus operates at a fixed standard gain, while the gain of the AGC amplifier 14 varies so as to carry out normal automatic gain control, keeping the intermediate-frequency signal safely below the saturation level of the intermediate-frequency amplifier 16.

When the value of RSSI IN is in the range between RSSI TH1 and RSSI TH2, the RSSI OUT2 and LNA GAIN ADJ signals vary continuously while the RSSI OUT1 and RX AGC ADJ remain fixed. In this range the decreasing gain of the low-noise amplifier 12 keeps the intermediate-frequency signal below the saturation level of the intermediate-frequency amplifier 16, and also reduces the level of any interfering signals that may be present in the radio-frequency signal, thereby preventing saturation of the bandpass filter and mixer 13.

When the received baseband signal level is high enough that RSSI IN exceeds RSSI TH2, the RSSI OUT1 and RX AGC ADJ signals again vary continuously while RSSI OUT2 and LNA GAIN ADJ remain fixed. The low-noise amplifier 12 now operates at a fixed reduced gain, lower than the standard gain, while the gain of the AGC amplifier 14 varies to keep the intermediate-frequency signal below the saturation level.

In the range between RSSI TH1 and RSSI TH2, when the AGC amplifier 14 is held at a fixed gain, the automatic-gain-control function is taken over by the low-noise amplifier 12. Automatic gain control thus operates smoothly over the entire dynamic range of RSSI IN, with no abrupt changes. In the transmitting circuits, the TX AGC ADJ signal output by digital-to-analog converter 34 changes smoothly, making for stable control of the transmit power level. In the receiving circuits, the power level of the intermediate-frequency signal is kept within a range suitable for the operation of the bandpass filter 15, intermediate-frequency amplifier 16, and digital demodulator 17, and the combined power level of the baseband signals RX I DATA and RX Q DATA is kept within a certain range that includes the range between RSSI TH1 and RSSI TH2.

Next, the saturation-avoidance effect of the circuit in FIG. 3 will be described with reference to FIGS. 4 and 5.

Figure 4:
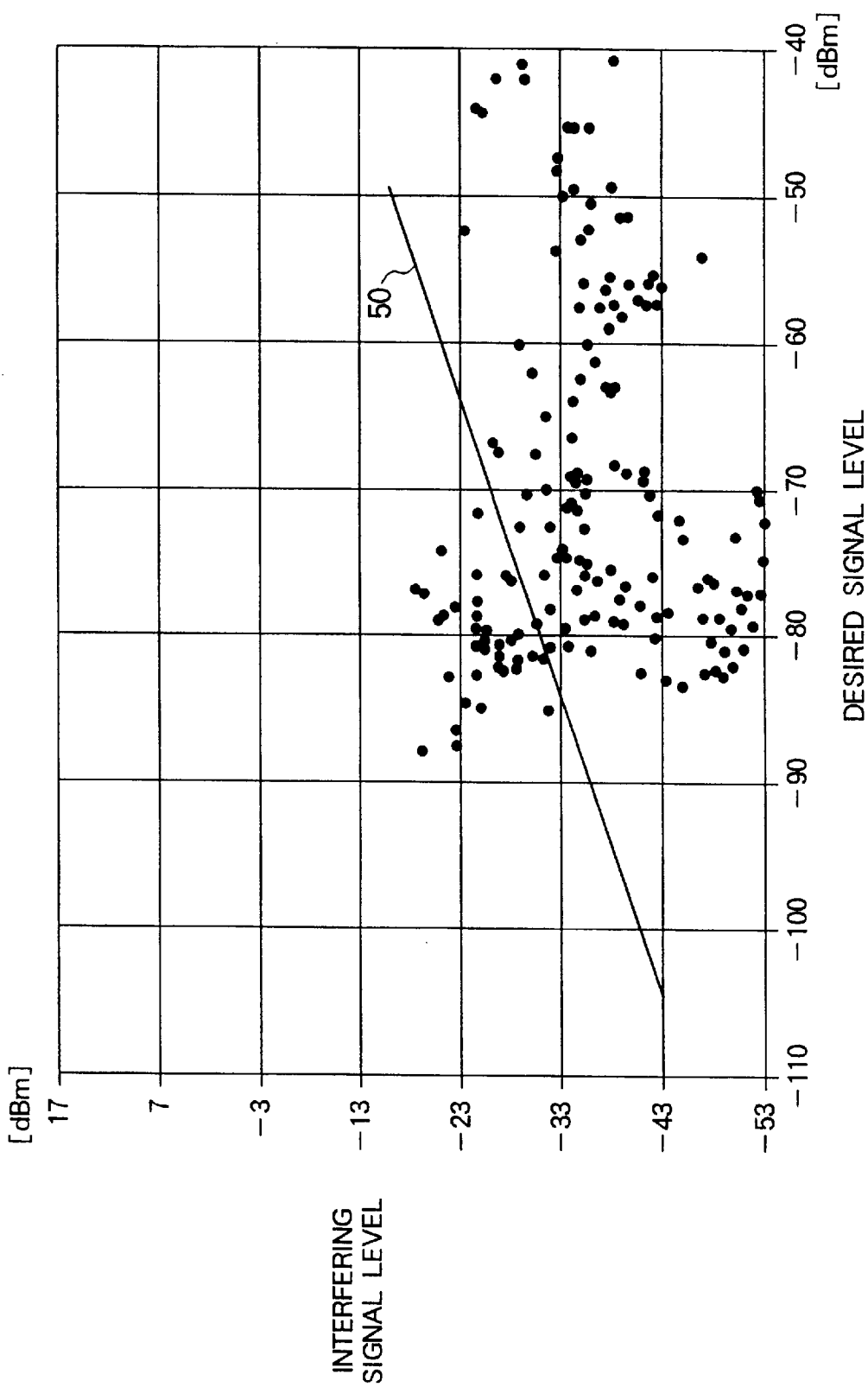
FIG. 4 is a scatter plot of typical pairs of desired-signal and interfering-signal power levels.

FIG. 4 is a scatter plot of data taken from a geographical area in which CDMA and AMPS systems both operate. The field strength of the desired CDMA carrier signal received at the antenna of a mobile CDMA receiver is shown in milliwatt decibels (dBm) on the horizontal axis; the field strength of the interfering AMPS carrier signal received at the same antenna is shown on the vertical axis. The black dots are data points indicating the field strengths of both carrier signals. The straight line 50 is the line below which a CDMA receiver complying with North American Intermediate Standard IS-98 must be capable of maintaining linear operation. About one-fourth (25%) of the data points lie above the line 50, indicating that the user of a CDMA receiver which merely complies with the IS-98 standard can expect intermodulation interference about one-fourth of the time.

Figure 5:
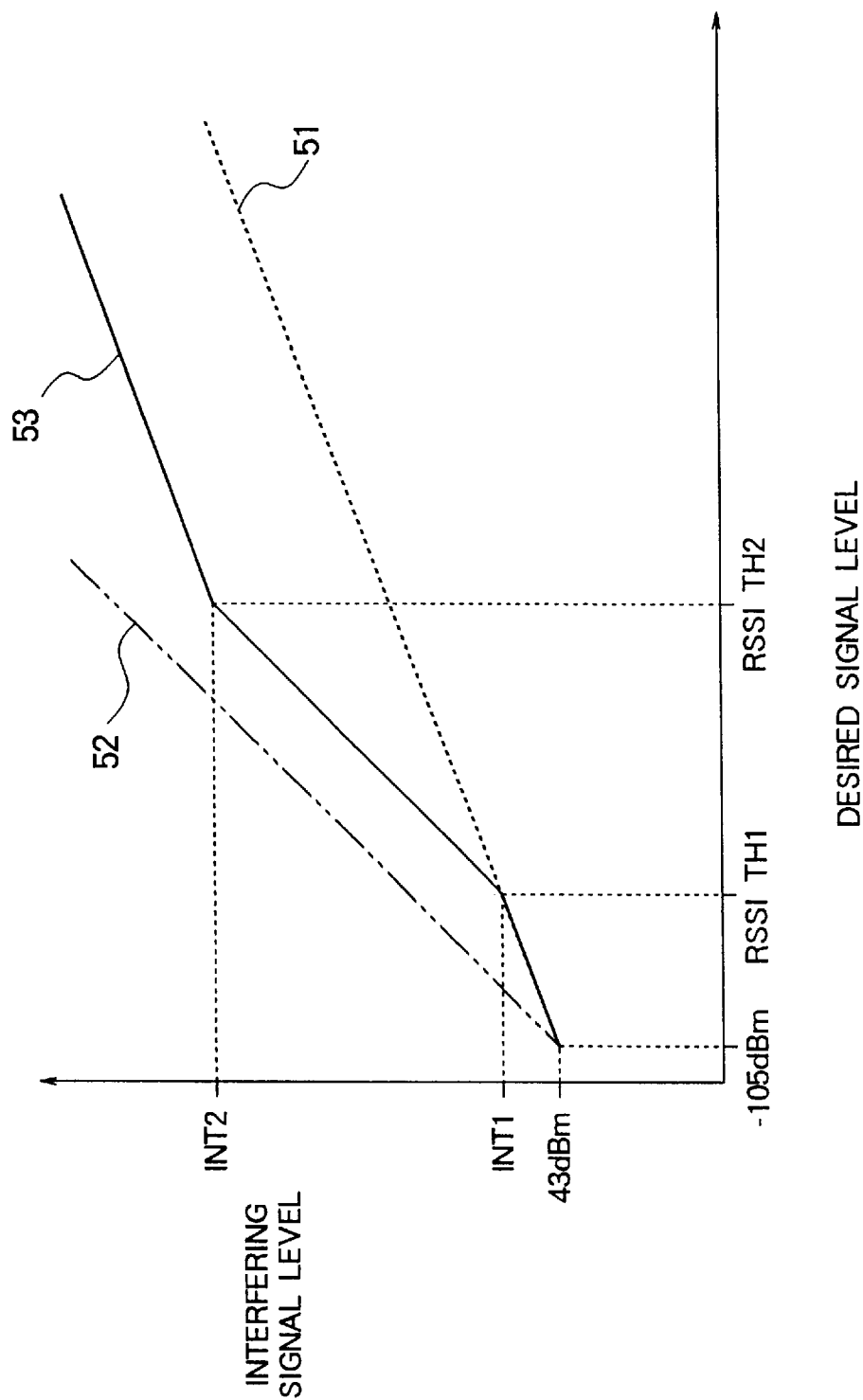
FIG. 5 illustrates the saturation-prevention characteristic of the circuit in FIG. 3.

FIG. 5 illustrates the effect of the novel anti-saturation control circuit, again with the desired signal level and interfering signal level indicated in decibels (dBm) on the horizontal and vertical axes. The desired signal levels corresponding to RSSI TH1 and RSSI TH2 are indicated on the horizontal axis. Line 51 is the same as line 50 in FIG. 4.

Line 52 is a line with a slope adjusted to catch substantially all of the data points in FIG. 4. If a CDMA receiver could be made to operate linearly at all points below line 52, by steadily reducing the gain of the low-noise amplifier 12 throughout the entire dynamic range of RSSI IN, that would eliminate substantially all intermodulation interference, but a serious loss of receiver sensitivity would occur due to inadequate amplification at the low end of the RSSI IN dynamic range.

Line 53 represents the interference tolerance characteristic of the novel circuit. In the comparatively wide range between RSSI TH1 and RSSI TH2, the gain of the low-noise amplifier 12 is gradually reduced and the interference tolerance characteristic parallels line 52. Above and below this range, the gain of the low-noise amplifier 12 is held constant, and the interference tolerance characteristic parallels line 51. INT1 indicates the level of interference at which anti-saturation control begins to take effect, and INT2 indicates the level at which the full anti-saturation effect is reached.

A comparison of FIG. 4 with FIG. 5 shows that the area below line 53, in which the receiver incorporating the novel anti-saturation control circuit in FIG. 3 behaves linearly and avoids intermodulation interference, includes almost all of the data points in FIG. 4. The receiver is thus able to operate in the same geographical area as an AMPS system with very little intermodulation interference. At the same time, there is no unnecessary loss of sensitivity at the low end of the RSSI IN range, where lines 51 and 53 coincide.

Figure 6:
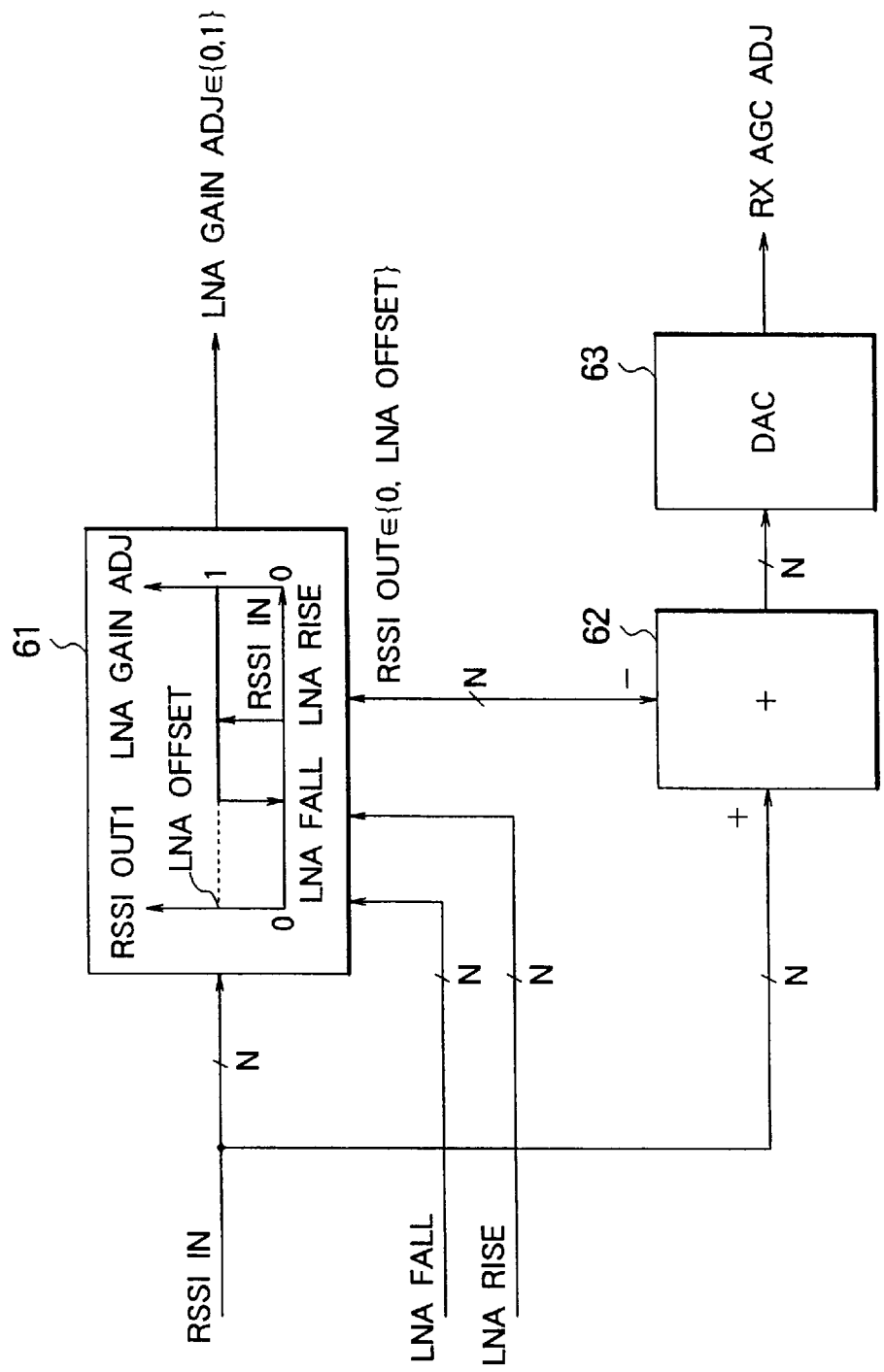
FIG. 6 illustrates a conventional circuit for generating the adjustment signals shown in FIG. 1.

For comparison, FIG. 6 shows a conventional anti-saturation control circuit of the type described earlier, employing a step-function control rule with hysteresis. This circuit, which replaces the control circuit shown in FIG. 3, comprises a binary decision circuit 61, a subtracting circuit 62, and a digital-to-analog converter 63. The binary decision circuit 61 receives the RSSI IN signal produced by the indicator circuit in FIG. 2, together with two fixed threshold signals: LNA FALL and LNA RISE. The LNA GAIN ADJ signal output by this circuit has only two values: zero and one. When RSSI IN is less than the LNA FALL threshold, the LNA GAIN ADJ value is zero. When RSSI IN is greater than LNA RISE, the LNA GAIN ADJ value is one. When RSSI IN is between these two thresholds, LNA GAIN ADJ remains at its current value of either zero or one.

The binary decision circuit 61 also outputs an RSSI OUT signal with a value that varies in the same step-like fashion, taking on either a value of zero or a certain fixed positive value (LNA OFFSET). The subtracting circuit 62 subtracts RSSI OUT from RSSI IN, and the digital-to-analog converter 63 converts the result to analog form to generate the RX AGC ADJ signal.

Figure 7:
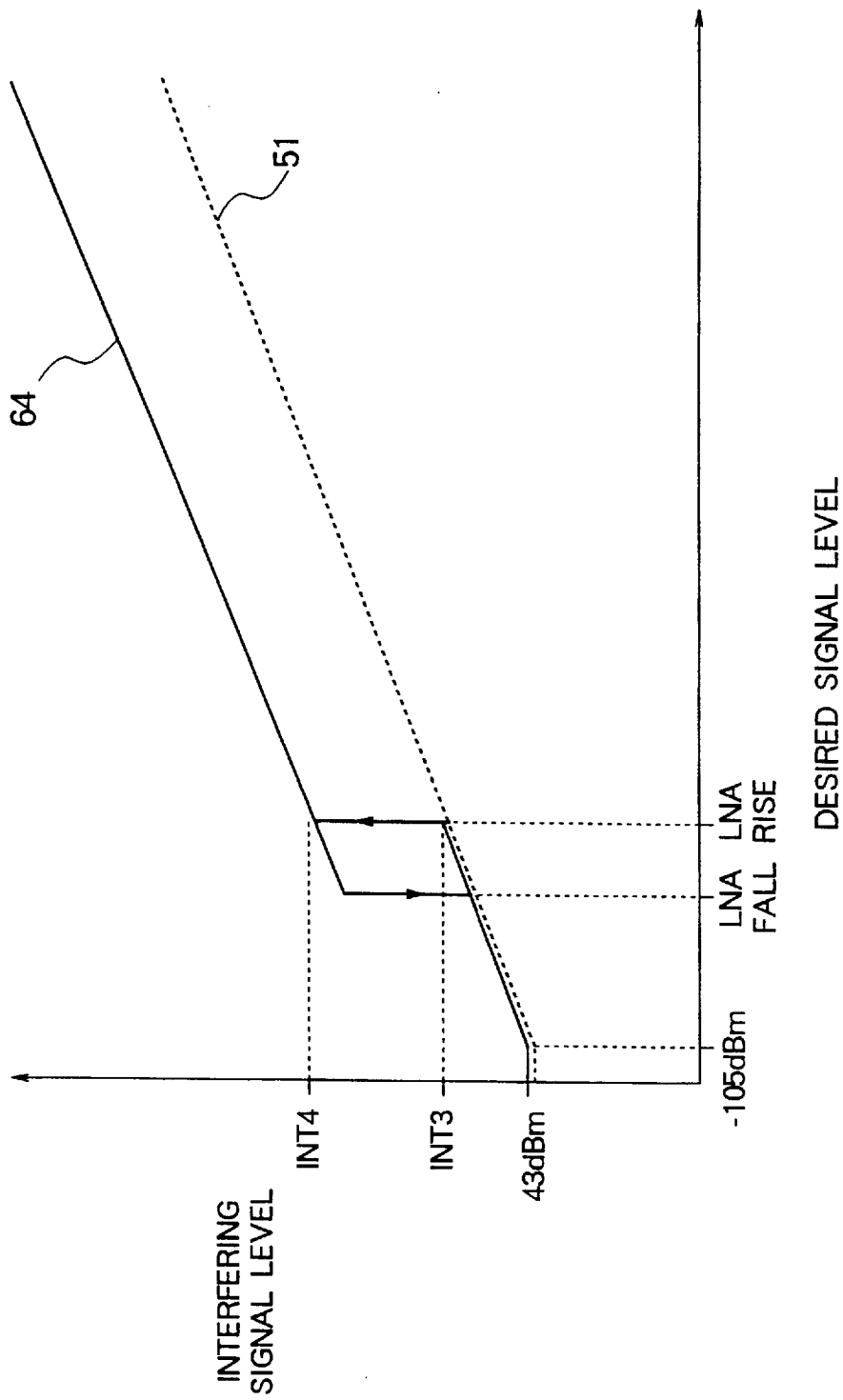
FIG. 7 illustrates the saturation-prevention characteristic of the circuit in FIG. 6.

FIG. 7 illustrates the interference tolerance characteristic of this conventional circuit. The horizontal and vertical axes have the same meaning as in FIG. 5, with LNA FALL and LNA RISE now being indicated instead of RSSI TH1 and RSSI TH2. Line 51 is the same as in FIG. 5. By switching the gain of the low-noise amplifier 12 at LNA FALL and LNA RISE, the conventional circuit is able to maintain linear operation below line 64.

INT3 and INT4 indicate the size of the anti-saturation effect. When the desired signal level, as indicated by RSSI IN, is at the LNA RISE level, the reduced low-noise amplifier gain enables interference up to level INT4 to be tolerated, instead of interference up to level INT3. The difference between INT4 and INT3 corresponds to the size of LNA OFFSET in FIG. 6.

Figure 8:
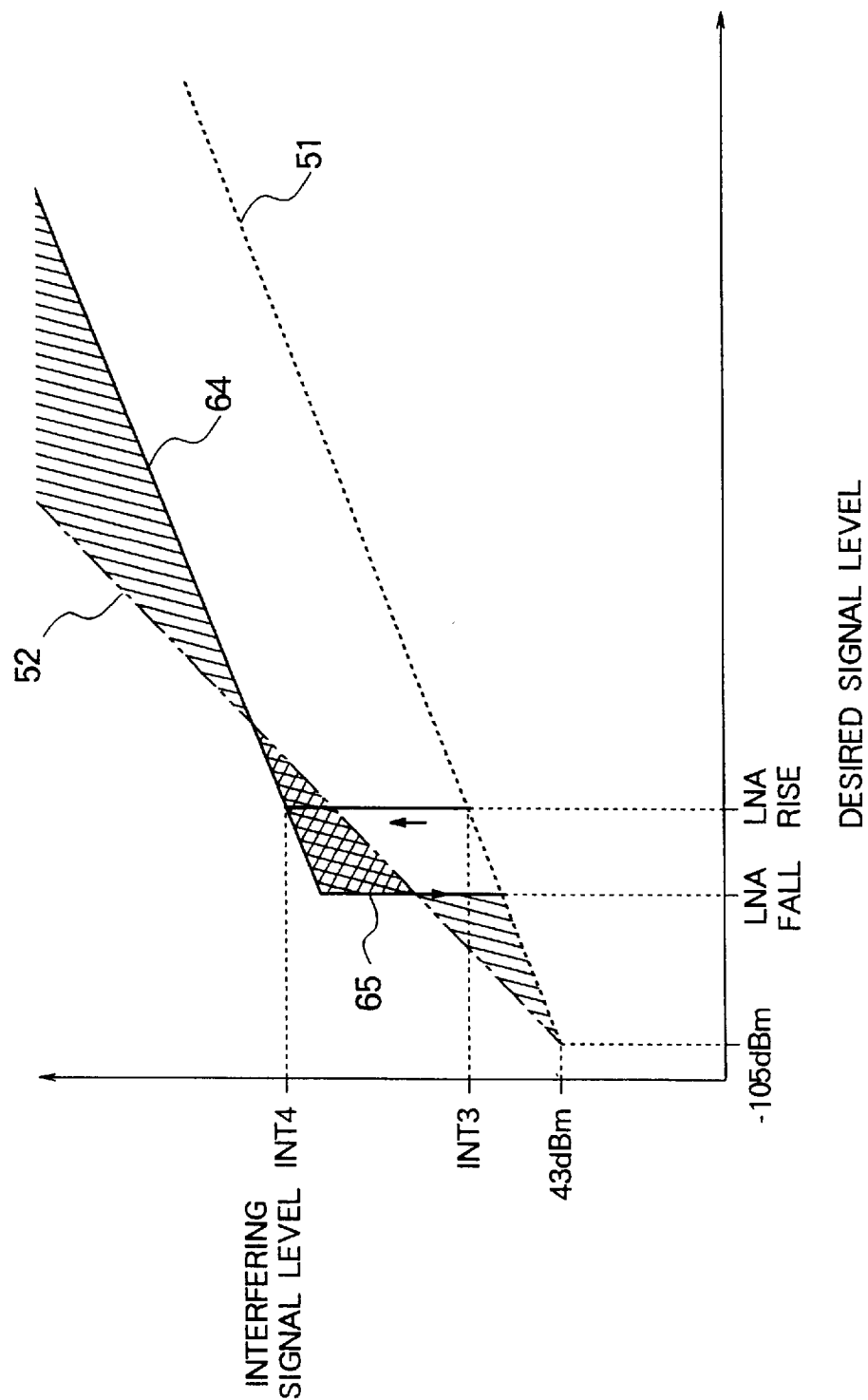
FIG. 8 illustrates a problem area in the characteristic shown in FIG. 7.

FIG. 8 compares the interference tolerance characteristic 64 of this conventional circuit with the line 52 that avoids all intermodulation interference. The horizontal and vertical axes and line 52 have the same meanings as in FIG. 5. Hatching is used to indicate the difference between lines 52 and 64. Due to the step-like control characteristic, there is a large area 65 (indicated by cross-hatching) in which the conventional circuit operates above line 52. In this area the gain of the low-noise amplifier 12 is reduced by an unnecessarily large amount, resulting in an undesirable loss of receiver sensitivity.

It would be possible to reduce the size of area 65 by reducing the low-noise-amplifier gain by a lesser amount, thereby lowering the value of INT4. In that case, however, much of the anti-saturation effect would be lost, and intermodulation interference would be likely to occur at RSSI IN levels around LNA RISE.

In contrast, in the invented anti-saturation circuit, the amount of gain reduction is limited only by the capabilities of the low-noise amplifier 12. A large gain reduction, such as thirty decibels, for example, can be accommodated by increasing the upper threshold RSSI TH2. There is no particular upper limit on the value of INT2 in FIG. 5.

Although FIGS. 5 and 8 are drawn with RSSI TH1 equal to LNA FALL, due to the continuous manner of operation of the circuit in FIG. 3, it is possible (and preferable) for RSSI TH1 to be set at a lower level than LNA FALL. Moreover, the interval between RSSI TH1 and RSSI TH2 can be much wider than the interval between LNA FALL and LNA RISE. The corresponding interval between interference levels INT1 and INT2 in FIG. 5 can therefore also be wider than the interval between the interference levels INT3 and INT4 in corresponding to LNA FALL and LNA RISE FIG. 8. The invented circuit can accordingly avoid saturation and intermodulation interference over a wider range of received signal levels than the conventional circuit, without undesirable loss of receiver sensitivity.

The lack of hysteresis in the control characteristic of the invented circuit is an advantage, not only in that abrupt gain changes can be avoided, but also in that hysteresis-free control signals are easier to generate. For each value of RSSI IN, as shown in FIG. 3, RSSI OUT2 takes on only one value, instead of the two value taken on by RSSI OUT between LNA FALL and LNA RISE in FIG. 6.

In the receiving apparatus described above, the variable-gain element in the front-end section 2 was the low-noise amplifier 12, but the invention can be practiced with other variable-gain elements. The signal output by the digital-to-analog converter 44 in FIG. 3 can control the gain of an element in the bandpass filter and mixer 13, for example, or the gain of a variable attenuator inserted between the low-noise amplifier 12 and the bandpass filter and mixer 13. The variable-gain element may comprise either active or passive electronic devices, or a combination of both.

The RSSI OUT2 signal was shown as increasing in a continuous, linear manner in the range between RSSI TH1 and RSSI TH2, but this is not a necessary requirement. In fact, since RSSI OUT2 is an N-bit digital signal, it has at most $2^N$ discrete levels (where N>1), so a more detailed drawing would show that the RSSI OUT2 characteristic has a staircase-like form. In general, it is only necessary for RSSI OUT2 to vary monotonically over the range from RSSI TH1 to RSSI TH2, without hysteresis, and to assume at least one value between the value assumed at RSSI TH1 and the value assumed at RSSI TH2.

Similarly, it is not necessary for the variable-gain element in the front-end section 2 to have a continuously variable gain. A variable-gain element with at least three discrete gain settings can be used.

It is not necessary for the gain of the automatic-gain-control amplifier 14 to be held constant while RSSI IN is in the range between RSSI TH1 and RSSI TH2. Depending on the way in which the RSSI OUT2 signal varies in this range, the RSSI OUT1 signal may vary in a compensatory manner, RSSI OUT1 decreasing when RSSI OUT2 increases, for example; or RSSI OUT1 and RSSI OUT2 may both increase simultaneously.

That having been said, it is nevertheless desirable for RSSI OUT2 to vary in a continuous manner, or a substantially continuous manner, and the arrangement shown in FIG. 3, in which RSSI OUT1 and RSSI OUT2 vary over different ranges of RSSI IN, has the advantage of simple design.

No restriction is placed on the structure of the level-converting circuits 41 and 43. They may have digital inputs and outputs, as shown in FIG. 3, or analog inputs and outputs. In the digital case, the level-converting circuits 41 and 43 may comprise specially-designed logic circuits, or both level-converting circuits 41 and 43 may be implemented by a program executed by a computing device such as a microprocessor or microcontroller. In this case, arbitrary control functions can be constructed from values stored in a read-only memory (ROM).

Although the invention has been described in relation to the North American CDMA digital cellular system, the invention can also be practiced in other communication systems, not necessarily limited to wireless systems, in which a desired signal is accompanied by a strong interfering signal and measures must be taken to prevent intermodulation. Moreover, in a cellular system, use of the invention is not limited to mobile stations; the invention can also be used to prevent intermodulation at base stations.

Although both transmitting and receiving circuits were shown in FIG. 1, the invention can be practiced in receiving apparatus without transmitting circuits, and if transmitting circuits are present, it is not necessary for the transmit gain to be controlled according to the received signal strength.

Those skilled in the art will recognize that further variations are possible within the scope claimed below.

What is claimed is:

1. A method of preventing saturation in a receiver having a front-end section with a first variable-gain element, said front-end section receiving a high-frequency signal, amplifying said high-frequency signal, and converting said high-frequency signal to a lower-frequency signal, said receiver also having a back-end section for processing said lower-frequency signal, comprising the steps of:

generating from said lower-frequency signal an indicator signal indicating a power level of said lower-frequency signal;

operating said first variable-gain element with a first gain when said indicator signal indicates that said power level is below a first threshold;

operating said first variable-gain element with a second gain, lower than said first gain, when said indicator signal indicates that said power level is above a second threshold higher than said first threshold; and operating said first variable-gain element with at least one gain intermediate between said first gain and said second gain, when said indicator signal indicates that said power level is between said first threshold and said second threshold; wherein as said power level increases from said first threshold to said second threshold, the gain of said first variable-gain element decreases without hysteresis from said first gain to said second gain.

2. The method of claim 1 wherein, as said power level increases from said first threshold to said second threshold, the gain of said first variable-gain element decreases continuously from said first gain to said second gain.

3. The method of claim 1, wherein said receiver also has a second variable-gain element, comprising the further steps of:

generating an automatic-gain-control signal from said indicator signal;

using said automatic-gain-control signal to control said second variable-gain element, thereby keeping said power level within a predetermined range including said first threshold and said second threshold; and adjusting said automatic-gain-control signal to compensate for the gain of said first variable-gain element.

4. The method of claim 3, wherein said automatic-gain-control signal remains constant when said power level is between said first threshold and said second threshold.

5. An anti-saturation circuit for a receiver having a front-end section and a back-end section, said front-end section having a first variable-gain element, said front-end section receiving a high-frequency signal, said front-end section amplifying said high-frequency signal, said front-end section converting said high-frequency signal to a lower-frequency signal, comprising:

an indicator circuit generating an indicator signal indicating a power level of said lower-frequency signal; and a control circuit receiving said indicator signal and generating therefrom a first control signal that controls said first variable-gain element; wherein said first control signal varies monotonically, assuming at least three different values, when said power level varies in a first range, and said first control signal does not vary when said power level is outside said first range.

6. The anti-saturation circuit of claim 5, wherein said first variable-gain element is a low-noise amplifier.

7. The anti-saturation circuit of claim 5, wherein said receiver also has a second variable-gain element for controlling the power level of said lower-frequency signal, and said control circuit generates a second control signal that controls said second variable-gain element to keep said power level within a second range, said second range including said first range.

8. The anti-saturation circuit of claim 7, wherein said second control signal remains fixed when said power level is in said first range.

9. The anti-saturation circuit of claim 7, wherein said second variable-gain element is disposed in said back-end section.

10. The anti-saturation circuit of claim 7, wherein said second variable-gain element is an automatic-gain-control amplifier.

11. The anti-saturation circuit of claim 5, wherein:

said receiver also has an antenna coupled to said front-end section, said antenna receiving a desired carrier signal and an interfering carrier signal; and said first control signal reduces the gain of said variable-gain element to a level sufficiently low to avoid intermodulation between said desired carrier signal and said interfering carrier signal.

* * * * *